(12) United States Patent
Fujii et al.

(10) Patent No.: US 9,701,565 B2
(45) Date of Patent: Jul. 11, 2017

(54) GLASS SHEET LAMINATE AND METHOD FOR PRODUCING SAME

(71) Applicant: Nippon Electric Glass Co., Ltd., Shiga (JP)

(72) Inventors: Takahide Fujii, Shiga (JP); Naotoshi Inayama, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 100 days.

(21) Appl. No.: 14/442,498

(22) PCT Filed: Oct. 24, 2013

(86) PCT No.: PCT/JP2013/078862
§ 371 (c)(1),
(2) Date: May 13, 2015

(87) PCT Pub. No.: WO2014/077102
PCT Pub. Date: May 22, 2014

(65) Prior Publication Data
US 2016/0272532 A1    Sep. 22, 2016

(30) Foreign Application Priority Data
Nov. 13, 2012    (JP) .................. 2012-249305

(51) Int. Cl.
C03B 33/08    (2006.01)
C03B 23/24    (2006.01)
(Continued)

(52) U.S. Cl.
CPC .......... *C03B 33/082* (2013.01); *C03B 23/245* (2013.01); *C03B 25/025* (2013.01);
(Continued)

(58) Field of Classification Search
None
See application file for complete search history.

(56) References Cited

U.S. PATENT DOCUMENTS 5,902,368 A * 5/1999 Witzmann .............. C03B 21/06
65/105
2004/0207314 A1 10/2004 Aitken et al.
(Continued)

FOREIGN PATENT DOCUMENTS

CN    1693244    11/2005
JP    7-68395    3/1995
(Continued)

OTHER PUBLICATIONS

Office Action issued Sep. 2, 2016 in corresponding Chinese Application No. 201380056195.5, with partial English translation.
(Continued)

*Primary Examiner* — Lisa Herring
(74) *Attorney, Agent, or Firm* — Wenderoth, Lind & Ponack, L.L.P.

(57) ABSTRACT

A method of manufacturing a glass sheet laminate to be formed by integrally laminating two glass sheets includes: laminating the two glass sheets by bringing surfaces thereof in a vicinity of an outer peripheral portion into surface contact with each other; performing laser fusing so as to cut and remove a part of a surface contact portion under a state in which the surface contact portion has a surface roughness of 2.0 nm or less; and processing a fusing end surface of the surface contact portion into a curved surface and sealing the fusing end surface with heat generated when the laser fusing is performed.

6 Claims, 13 Drawing Sheets

(51) Int. Cl.
- *C03B 25/04* (2006.01)
- *C03B 33/07* (2006.01)
- *H01L 51/52* (2006.01)
- *C03B 25/02* (2006.01)

(52) U.S. Cl.
CPC .......... *C03B 33/07* (2013.01); *H01L 51/5253* (2013.01); *H01L 51/524* (2013.01)

(56) References Cited

U.S. PATENT DOCUMENTS

| | | |
|---|---|---|
| 2005/0001545 A1 | 1/2005 | Aitken et al. |
| 2006/0009109 A1 | 1/2006 | Aitken et al. |
| 2007/0007894 A1 | 1/2007 | Aitken et al. |
| 2010/0304151 A1 | 12/2010 | Tuennermann et al. |
| 2011/0045229 A1 | 2/2011 | Takaya et al. |
| 2011/0291529 A1 | 12/2011 | Numata |
| 2013/0091897 A1* | 4/2013 | Fujii .................. C03B 33/0222 65/112 |
| 2013/0225390 A1* | 8/2013 | Ellison .................. C03C 3/093 501/66 |
| 2014/0141217 A1* | 5/2014 | Gulati .................. C03C 3/091 428/212 |
| 2014/0318182 A1* | 10/2014 | Coppola .................. C03B 17/067 65/29.21 |

FOREIGN PATENT DOCUMENTS

| | | |
|---|---|---|
| JP | 2000-281368 | 10/2000 |
| JP | 2005-281126 | 10/2005 |
| JP | 2006-524419 | 10/2006 |
| JP | 2011-37685 | 2/2011 |
| JP | 2011037685 A * | 2/2011 |
| WO | 01/57638 | 8/2001 |
| WO | 2010/097908 | 9/2010 |

OTHER PUBLICATIONS

International Preliminary Report on Patentability and Written Opinion of the International Searching Authority issued May 19, 2015 in International (PCT) Application No. PCT/JP2013/078862.

International Search Report issued Dec. 17, 2013 in International (PCT) Application No. PCT/JP2013/078862.

Extended European Search Report issued Aug. 16, 2016 in corresponding European Application No. 13854877.1.

* cited by examiner

GLASS SHEET LAMINATE AND METHOD FOR PRODUCING SAME

TECHNICAL FIELD

The present invention relates to a technology of improving a glass sheet laminate to be formed by integrally laminating a plurality of glass sheets, in particular, a glass sheet laminate to be used as a glass package containing a device therein.

BACKGROUND ART

As is well known, a glass package containing a device such as an organic light-emitting diode (OLED) between glass sheets has been widely used. The reason therefor is that a glass sheet laminate forming the glass package has high gas-barrier property derived from the glass sheets. That is, when the device such as the OLED is exposed to oxygen and moisture in the surrounding environment thereof, the device is liable to degrade, and hence the device is sealed with the glass sheets.

Incidentally, this type of glass package is usually manufactured by containing a device between two glass sheets and sealing the periphery of the device with a frit. Specifically, for example, in JP 2006-524419 A, there is disclosed that, under a state in which a device is contained between two glass sheets, a frit is heated and molten with a laser, to thereby form a sealed structure.

Technical Problem

However, when the sealed structure is formed by using a frit, it is necessary to separately prepare the frit in addition to glass, thereby causing a significant increase in manufacturing cost. In addition, when the thermal expansion coefficient of the glass sheet is significantly different from the thermal expansion coefficient of the frit, a sealed portion may easily break because of the difference in thermal expansion between the glass sheet and the frit. Thus, it is necessary to blend an additive to adjust the thermal expansion coefficient of the frit, which leads to a further significant increase in manufacturing cost.

Further, in recent years, manufacture of a thinner glass sheet has been actually promoted, and hence there is a problem in that when an edge portion of an end surface of a glass sheet is sharp, the glass sheet is liable to break and the airtightness of the sealed portion is easily degraded. Thus, it is considered to perform chamfering processing on each end surface of the glass sheet. However, when the chamfering processing is performed on each side of pieces of the glass sheet cut into a predetermined size, a further significant increase in manufacturing cost is inevitable as a result. Moreover, there is another problem in that it is difficult to perform mechanical chamfering processing itself on a thin glass sheet.

SUMMARY OF INVENTION

In view of the above-mentioned circumstances, a technical object of the present invention is to provide a glass sheet laminate capable of reliably securing airtightness of its inner space while reducing manufacturing cost thereof.

Solution to Problem

According to one embodiment of the present invention, which is devised to achieve the above-mentioned object, the present invention provides a method of manufacturing a glass sheet laminate to be formed by integrally laminating a plurality of glass sheets, the method comprising: laminating the plurality of glass sheets by bringing their surfaces including a preset cutting line into surface contact with each other so as to form a surface contact portion; performing laser fusing along the preset cutting line included in the surface contact portion under a state in which the surface contact portion has a surface roughness Ra of 2.0 nm or less; and processing a fusing end surface of the surface contact portion into a curved surface and sealing the fusing end surface with heat generated when the laser fusing is performed. Herein, the mode of laminating the plurality of glass sheets by bringing their surfaces including the preset cutting line into surface contact with each other comprises a case of laminating the plurality of glass sheets by bringing only partial regions of their surfaces corresponding to the preset cutting line into surface contact with each other, and a case of laminating the plurality of glass sheets by bringing their entire surfaces into surface contact with each other. Further, all the glass sheets do not necessarily have the same size, and may comprise, for example, a glass sheet having a glass surface at only its surface contact portion to play a role as a spacer (such as a frame-like glass sheet). Besides, the "surface roughness Ra" refers to a value obtained by measurement using a method in accordance with JIS B0601: 2001 (the same applies hereinafter).

According to such a structure, the plurality of glass sheets are laminated under a state in which their surfaces including the preset cutting line are held in surface contact with each other. In this laminated state, the surface roughness Ra of the surface contact portion of the plurality of glass sheets is set to 2.0 nm or less, and hence the surfaces are brought into close contact with each other at the surface contact portion in a separable manner without using an adhesive or the like. The close contact force is considered to be generated due to the van der Waals force between molecules in the glass surfaces facing each other or to a hydrogen bond between silanol groups formed by adsorption of moisture in the air. Then, when the laser fusing is performed on such a closely fixed surface contact portion, the surface contact portion is completely sealed with the heat generated when the laser fusing is performed. In this case, in the region within the surface contact portion, which is affected by the heat generated when the laser fusing is performed, a part in which the glass surfaces are joined at a temperature equal to or more than a softening point thereof (the part is hereinafter referred to as "welded portion" in some cases) is formed, and in addition, a part in which the glass surfaces are joined at a temperature equal to or less than the softening point thereof (note that, the part is hereinafter referred to as "quasi-welded portion" in some cases) is also formed. Thus, the sealing of the surface contact portion is promoted. Herein, the reason why the quasi-welded portion is formed is considered that a dehydration reaction occurs between silanol groups that form the hydrogen bond in the glass surfaces facing each other, thus forming a firmer covalent bond therebetween.

Further, when the laser fusing is performed, the glass sheets are cut while being molten, and hence the fusing end surface of the glass sheets can be processed into the curved surface. Thus, even if chamfering processing is not separately performed afterward, the end surface can have a sufficient strength.

In the above-mentioned structure, it is preferred that the method further comprise annealing a vicinity of the fusing end surface through irradiation with a laser having a lower energy density (annealing laser) than a laser used for the laser fusing (fusing laser).

As a result, through the irradiation with the annealing laser, strain in the vicinity of the fusing end surface is removed, and hence it is possible to prevent deformation such as warpage of the glass sheet laminate and breakage due to the strain. Further, in this case, the surface contact portion in the vicinity of the fusing end surface is also heated through the irradiation with the annealing laser, and hence a dehydration reaction is considered to occur in a wider region in the surface contact portion. As a result, a sealed mode is obtained in which the quasi-welded portion having the glass surfaces joined at a temperature equal to or less than the softening point thereof is formed over a wider range, thereby being capable of securing higher airtightness.

In the above-mentioned structure, the method may further comprise: containing a functional member between the plurality of glass sheets; forming the surface contact portion around the functional member; and performing the laser fusing after the surface contact portion is formed. Herein, the functional member refers to a material or device capable of exerting a predetermined function, such as a phosphor, liquid crystal, an organic EL, an ITO film, a solar cell, a Li-ion battery, or an anti-reflective film.

As a result, the surface contact portion can tentatively seal the periphery of the functional member without applying heat before the laser fusing. Then, when the laser fusing is performed on the surface contact portion in this state, as described above, the glass at the surface contact portion is molten, thus being able to seal the periphery of the functional member completely. In addition, when the laser fusing is performed, the heating range of the glass sheets is limited to a narrower range irradiated with a laser in comparison to the heating range in the case of heating the glass sheets with a burner or the like, and hence the functional member can be prevented from being degraded by the heat.

In the above-mentioned structure, it is preferred that the method further comprise performing compression bonding of the surface contact portion before the laser fusing.

As a result, the close contact force of the surface contact portion before the laser fusing is further strengthened, and hence the accuracy of the sealing by the laser fusing is further improved.

In this case, the surface contact portion may be formed under a reduced-pressure atmosphere.

As a result, even in a case where foreign matter such as gas is included inside the laminate at the time of laminating the glass sheets and bubbles are formed, when the laminate is used under an environment such as a normal-pressure environment or an increased-pressure environment, the foreign matter and the bubbles are relatively pressurized, thereby shrinking the bubbles. Thus, even if bubbles are formed, various influences to be caused by the bubbles can be reduced.

In the above-mentioned structure, the plurality of glass sheets may be three or more glass sheets.

In the above-mentioned structure, it is preferred that the plurality of glass sheets have a total thickness of 0.5 mm or less.

According to one embodiment of the present invention, which is devised to achieve the above-mentioned object, the present invention provides a glass sheet laminate, comprising a plurality of glass sheets laminated integrally with each other, the glass sheet laminate having an outer peripheral portion formed of a fire polished surface with a curved surface, the outer peripheral portion having a sealed portion formed in a vicinity thereof, for sealing a gap between the plurality of glass sheets, the sealed portion comprising, in an order from the outer peripheral portion side: a first joining portion having glass surfaces directly integrated with each other in an inseparable manner; and a second joining portion having glass surfaces with a surface roughness Ra of 2.0 nm or less directly brought into close contact with each other in a separable manner. Herein, the term "directly" means that other members such as an adhesive are not interposed between the glass surfaces.

That is, the glass sheet laminate manufactured by the above-mentioned manufacturing method has such a distinctive structure as described above.

In the above-mentioned structure, it is preferred that the first joining portion comprise: a welded portion having the glass surfaces joined at a temperature equal to or more than a softening point; and a quasi-welded portion having the glass surfaces joined at a temperature equal to or less than the softening point.

As a result, the first joining portion has a wider range, and hence the airtightness of the glass sheet laminate can be further improved.

In the above-mentioned structure, it is preferred that the outer peripheral portion be formed of a fire polished surface with a simple arc.

As a result, the breakage strength of the outer peripheral portion of the glass sheet laminate is improved, thereby facilitating, for example, handling of the glass sheet laminate. In addition, the appearance shape thereof is more beautiful, and hence improvement of the product value can be expected.

In the above-mentioned structure, the glass sheet laminate may further comprise a functional member contained between the plurality of glass sheets, the functional member being surrounded by the sealed portion.

Advantageous Effects of Invention

As described above, according to the one embodiment of the present invention, it is possible to simultaneously perform the sealing operation for the gap between the glass sheets in a laminated state and the chamfering processing for the end surface of each of the glass sheets. Therefore, it is possible to reliably secure the airtightness of the inner space while reducing the manufacturing cost.

DESCRIPTION OF EMBODIMENTS

Embodiments of the present invention are described below with reference to the attached drawings.

(1) First Embodiment

Figure 1:
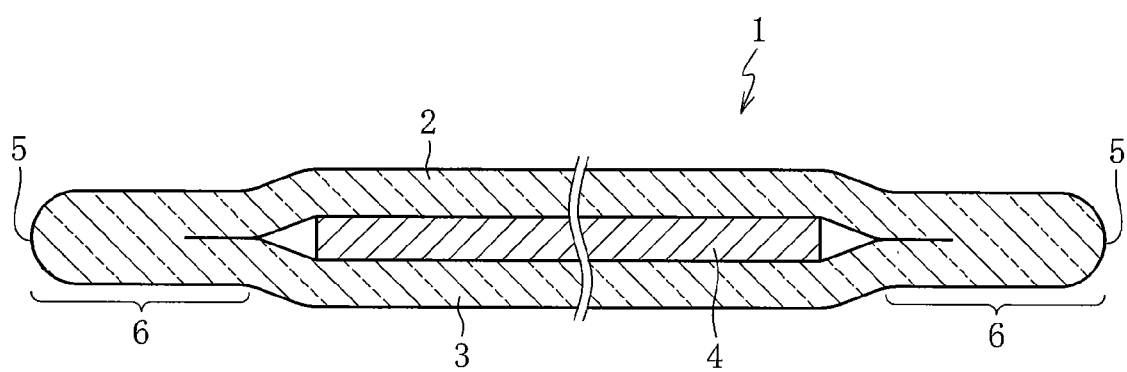
FIG. 1 is a cross-sectional view illustrating a glass sheet laminate according to a first embodiment of the present invention.

As illustrated in FIG. 1, in a glass sheet laminate 1 according to a first embodiment of the present invention, a plurality of glass sheets (two glass sheets in the example of the FIGS.) 2 and 3 are integrally laminated and a functional member 4 is contained therein in an airtight state.

Specifically, an outer peripheral portion 5 of the glass sheet laminate 1 is formed of a fire polished surface with a curved surface. In this embodiment, the outer peripheral portion 5 is formed of a curved surface with a smoothly-continuous substantially simple arc.

In the vicinity of the outer peripheral portion 5 of the glass sheet laminate 1, there is formed a sealed portion 6 for sealing a gap between the plurality of glass sheets 2 and 3. The sealed portion 6 is formed over the entire periphery of the glass sheet laminate 1. Note that, the glass sheet laminate 1 generally has a quadrangular shape in plan view, in which four corners are chamfered, but may have, for example, a triangular shape, another polygonal shape, or a circular shape. Note that, the reason why the glass sheet laminate 1 has a high degree of freedom in shape as described above is that the outer peripheral portion 5 of the glass sheet laminate 1 is formed through laser fusing as described later.

Figure 2:
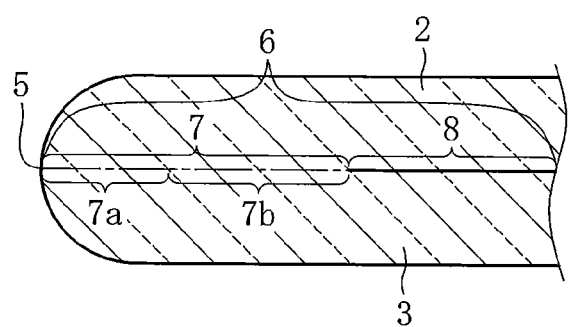
FIG. 2 is a cross-sectional view illustrating a sealed portion of the glass sheet laminate of FIG. 1 in an enlarged manner.

As illustrated in FIG. 2, the sealed portion 6 comprises, in an order from the outer peripheral portion 5 side, a first joining portion 7 having glass surfaces directly integrated with each other in an inseparable manner, and a second joining portion 8 having glass surfaces with a surface roughness Ra of 2.0 nm or less directly brought into close contact with each other in a separable manner. Note that, the glass sheets 2 and 3 may be separated from each other in the second joining portion 8 though the separation is not easy because a close contact force acts therebetween.

The first joining portion 7 comprises, in the order from the outer peripheral portion 5 side, a welded portion 7a having the glass surfaces joined at a temperature equal to or more than a softening point (for example, 700 to 1,000° C.), and a quasi-welded portion 7b having the glass surfaces joined at a temperature equal to or less than the softening point. That is, the first joining portion 7 (welded portion 7a and quasi-welded portion 7b) are thermally influenced so that the glass surfaces are joined firmly therein. Note that, in this embodiment, in the welded portion 7a and the quasi-welded portion 7b, no interface can be confirmed between the glass sheets 2 and 3. As a matter of course, the quasi-welded portion 7b may have an interface between the glass sheets 2 and 3.

In the second joining portion 8, flat and smooth glass surfaces are joined only with a close contact force derived from the surface property thereof without an adhesive or the like. This close contact force is considered to be generated due to the van der Waals force or to a hydrogen bond. That is, the second joining portion 8 maintains the joining state without being thermally influenced. Note that, in this embodiment, an interface between the glass sheets 2 and 3 can be confirmed in the second joining portion 8. Herein, the surface roughness Ra of each glass surface in the second joining portion 8 is preferably 1.0 nm or less, more preferably 0.5 nm or less (particularly preferably 0.2 nm or less).

Herein, when a frit or the like is used, the sealed portion is generally formed in a region spaced by about 3 to 5 mm from the periphery of the outer peripheral portion. However, the sealed portion 6 of this embodiment can be also formed in, for example, a region spaced by a width of about 0.05 to 1 mm from the outer peripheral portion 5. As a matter of course, the size of the region of the sealed portion 6 may be appropriately changed by adjusting the irradiation heat of a fusing laser or an annealing laser described below.

The thickness of each of the glass sheets 2 and 3 is, for example, 0.2 mm or less. When such thin glass sheets are used as the glass sheets 2 and 3, suitable flexibility can be imparted thereto, and hence, as illustrated in FIG. 1, under a state in which the functional member 4 is contained inside, the end portions of the glass sheets 2 and 3 are deformed so as to come close to each other toward the central side in the thickness direction, thereby being able to seal the end portions. Note that, in FIG. 1, the deformation amount of the glass sheets 2 and 3 is illustrated on an exaggerated scale.

Examples of the functional member 4 include a light emitting layer to be used in, for example, an organic light-emitting diode lighting device or an organic light-emitting diode display. As a matter of course, the glass sheet laminate 1 may be formed by appropriately omitting the functional member 4 or by interposing, for example, a resin film in place of the functional member 4. The glass sheet laminate 1 formed in the latter case may be used as, for example, a cover glass for an electronic appliance such as a cellular phone. Alternatively, any other member such as the functional member 4 may not be interposed between the glass sheets 2 and 3.

Figure 3A:
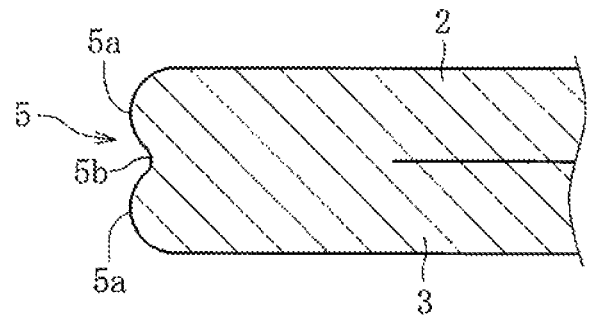
FIG. 3A is a partially enlarged cross-sectional view illustrating a modification of the glass sheet laminate according to the first embodiment.
Figure 3B:
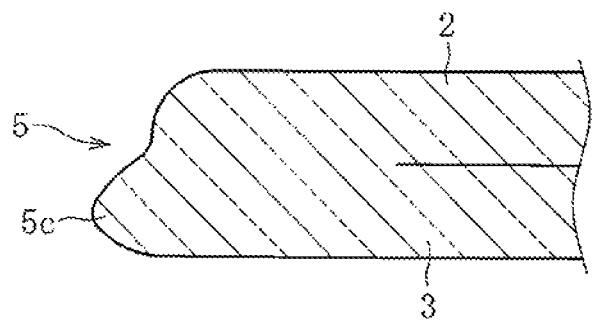
FIG. 3B is a partially enlarged cross-sectional view illustrating a modification of the glass sheet laminate according to the first embodiment.

Herein, the outer peripheral portion 5 of the glass sheet laminate 1 may have, for example, such curved surface shapes as illustrated in FIGS. 3A and 3B as well as a curved surface shaped with a substantially simple arc. That is, as illustrated in FIG. 3A, the outer peripheral portion 5 may have such a shape that a plurality of mountain portions 5a (two mountain portions in the example of FIG. 3A) are smoothly continuously formed via a valley portion 5b. Alternatively, as illustrated in FIG. 3B, the outer peripheral portion 5 may have such a shape that a middle part of the outer peripheral portion 5 bends to form a projection portion 5c that projects more than the other parts.

Next, a method of manufacturing the glass sheet laminate 1 having the structure as described above is described. Note that, the functional member 4 is omitted in some cases below for the sake of convenience of description.

Figure 4:
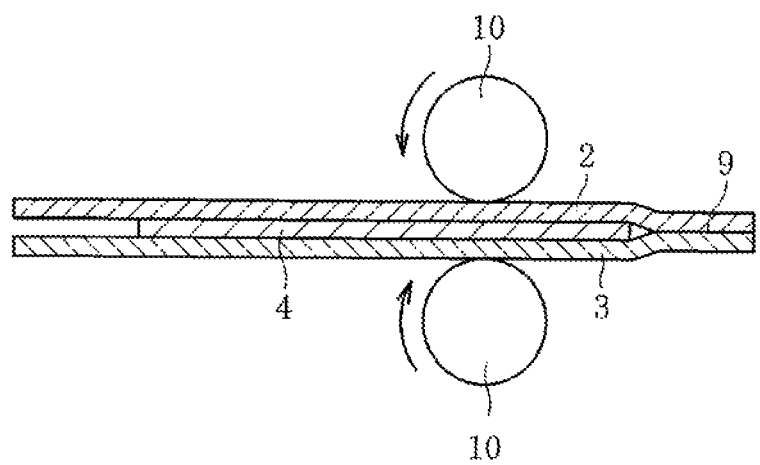
FIG. 4 is a view for illustrating a manufacturing procedure for the glass sheet laminate according to the first embodiment.

First, as illustrated in FIG. 4, the two glass sheets 2 and 3 having a surface roughness Ra of 2.0 nm or less are prepared. The glass sheets 2 and 3 can be formed by, for example, an overflow down-draw method. Then, the functional member 4 is formed or arranged on a front surface of the glass sheet 3 as one glass sheet, and the glass sheet 2 as another glass sheet is laminated on the glass sheet 3 so as to cover the functional member 4. In this state, parts of the glass surfaces of the two glass sheets 2 and 3, which extend beyond the functional member 4, are directly brought into close surface contact with each other, to thereby form a surface contact portion 9 around the functional member 4. Note that, as a matter of course, the surface roughness Ra of each of the glass sheets 2 and 3 may be 2.0 nm or less at the entire front and back surfaces thereof, but only a part of the glass surface, which forms the surface contact portion 9, may have the surface roughness Ra of 2.0 nm or less.

In addition, in this embodiment, the glass sheets 2 and 3 are pressed while being sandwiched by a pair of rollers 10, to thereby compressively bond the surface contact portion 9. Note that, the surface contact portion 9 may be formed under a reduced-pressure atmosphere, or the surface contact portion 9 may be formed under the own weight of the glass sheet 2 (3) without using the rollers 10 or the like. When a functional film such as an AR film is formed on the surfaces of the glass sheets 2 and 3 by treatment such as low-temperature vacuum deposition or low-temperature sputtering, reduced pressure treatment may be carried out inside a vacuum chamber used for the above-mentioned treatment as part of treatment such as deposition. As a matter of course, inside the vacuum chamber under a reduced-pressure atmosphere, the surface contact portion 9 may be pressed with the rollers 10 or the like.

Figure 5:
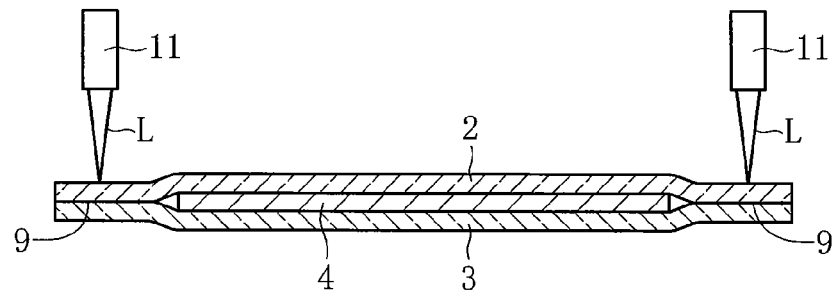
FIG. 5 is a view for illustrating the manufacturing procedure for the glass sheet laminate according to the first embodiment.

Next, as illustrated in FIG. 5, a laser fusing apparatus 11 irradiates the surface contact portion 9 with a laser (for example, $CO_2$ laser) L, and a partial region of the surface contact portion 9 on the outer peripheral portion side is cut off by laser fusing. The laser fusing is performed over the entire periphery of the glass sheets 2 and 3. Note that, in this case, the laser L is preferably radiated so that the temperature of the functional member 4 and its vicinity becomes 300° C. or less.

When the laser fusing is performed on the surface contact portion 9 as described above, the surface contact portion 9 is completely sealed due to generated heat. As a result, as illustrated in FIG. 2, the sealed portion 6 is formed in the manufactured glass sheet laminate 1 along the outer peripheral portion thereof. In this case, the sealed portion 6 is formed by performing the laser fusing on the surface contact portion 9 under a special close contact state, and hence the sealed portion 6 exhibits a characteristic sealed state derived from the surface contact portion 9. That is, in this case, the glass surfaces may be joined to each other in an inseparable manner even at a temperature equal to or less than the softening point, and hence, for example, the first joining portion 7 comprises the welded portion 7a having the glass surfaces joined at a temperature equal to or more than the softening point, and the quasi-welded portion 7b having the glass surfaces joined at a temperature equal to or less than the softening point.

Further, after the laser fusing is performed, the outer peripheral portion (fusing end surface) 5 of the glass sheet laminate 1 has a fire polished surface formed of a curved surface. Thus, even if chamfering processing is not performed separately, the outer peripheral portion 5 can have a sufficient end surface strength. Herein, in order to form the outer peripheral portion 5 of the glass sheet laminate 1 into a fire polished surface with a substantially simple arc, it is only necessary to appropriately adjust the thickness of each glass sheet and processing conditions such as a laser fusing rate.

Figure 6:
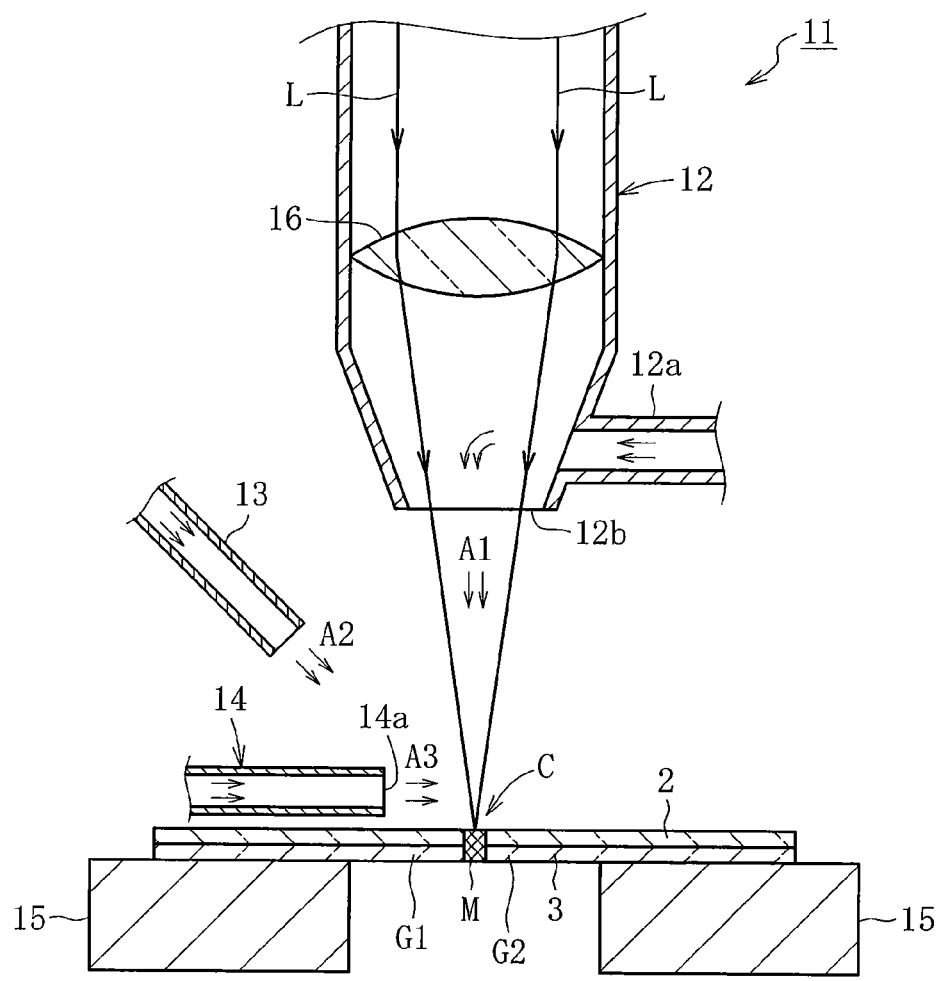
FIG. 6 is a cross-sectional view illustrating a laser fusing apparatus to be used for laser fusing according to the first embodiment.
Figure 7:
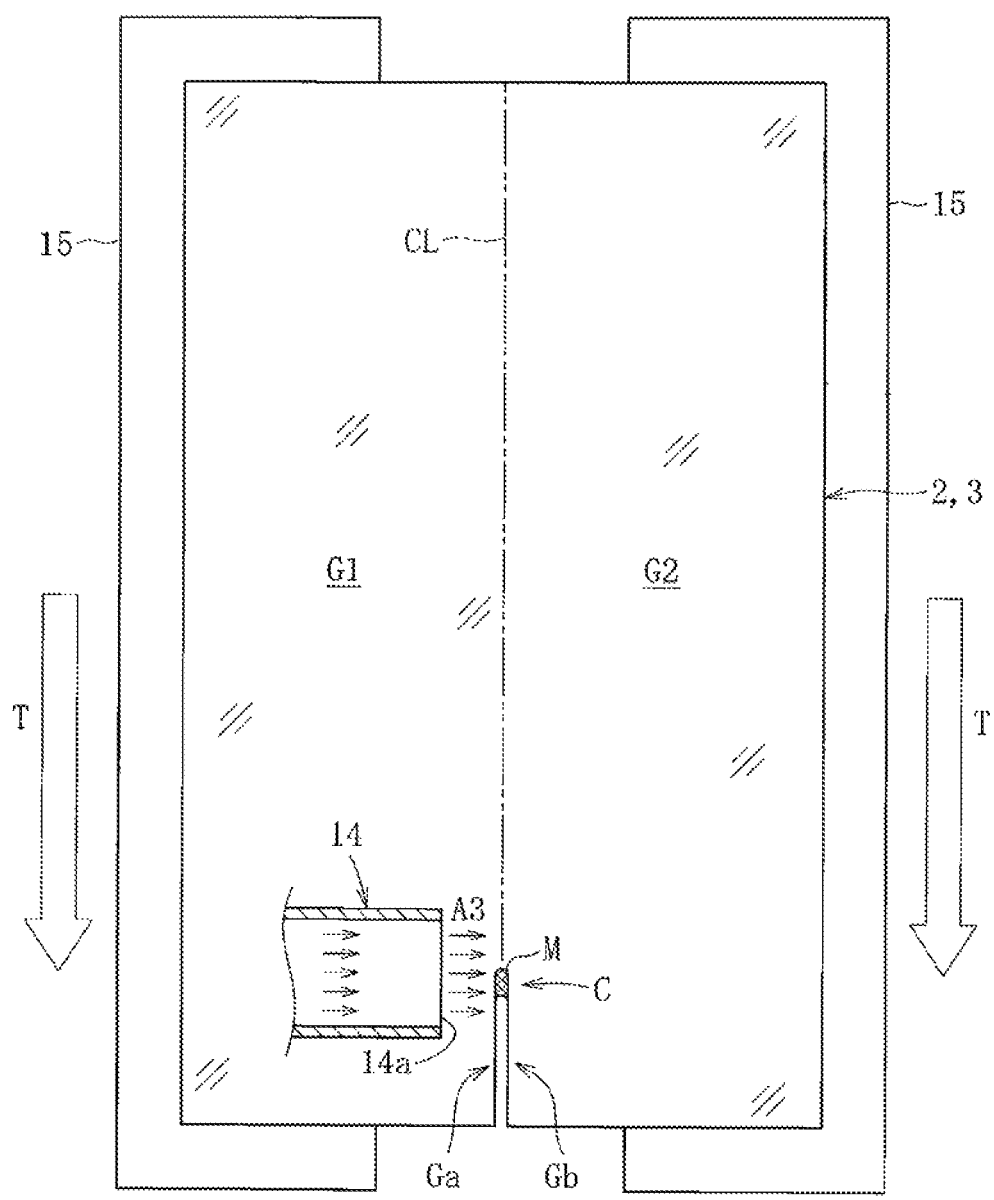
FIG. 7 is a plan view illustrating the laser fusing apparatus to be used for the laser fusing according to the first embodiment.

Next, one example of the laser fusing apparatus to be used for the above-mentioned laser fusing is described. As illustrated in FIG. 6 and FIG. 7, the laser fusing apparatus 11 comprises processing stages 15 for placing the two glass sheets 2 and 3 in a laminated state, a laser irradiator 12 for irradiating the front surface of the upper glass sheet 2 with the laser L, an assist gas jetting nozzle 13 for jetting an assist gas A2 for scattering molten glass M generated by melting the glass sheets through heating with the laser L, and a shaping gas jetting nozzle 14 for jetting a shaping gas A3 along the front surface of the glass sheet 2, which is located at an upper position, among the glass sheets 2 and 3. Note that, for the sake of convenience of description, the glass sheet 2 is referred to as "upper glass sheet" and the glass sheet 3 is referred to as "lower glass sheet" in some cases below, but the direction of the surfaces of the glass sheets 2 and 3 is not limited to the vertical direction. In addition, the glass sheets 2 and 3 are divided into a product portion G1 and a non-product portion G2, and the product portion G1 is used as the above-mentioned glass sheet laminate 1.

The laser irradiator 12 is installed at a fixed position and has a cylindrical proximal end portion and a mortar-like distal end portion. A lens 16 is mounted on an inner circumference wall of the proximal end portion, for converging the laser L emitted from a laser oscillator (not shown) to irradiate the front surface of the upper glass sheet 2 with the laser L. Further, a gas introducing pipe 12a is coupled to the distal end portion, for introducing a gas A1 to be jetted along an irradiation direction of the laser L into the inside of the laser irradiator 12, and an irradiation and jetting port 12b, through which the laser L and the gas A1 are radiated and jetted, is formed at the distal end portion.

The assist gas jetting nozzle 13 is installed at a fixed position as in the laser irradiator 12 so as to have a posture oblique to the front surface of the upper glass sheet 2. The assist gas jetting nozzle 13 has a cylindrical shape so that the assist gas A2 compressed in a gas compressor (for example, air compressor) (not shown) passes through the inside of the assist gas jetting nozzle 13 and is jetted toward an irradiation portion C of the laser L.

The shaping gas jetting nozzle 14 is installed at a fixed position as in the laser irradiator 12 and the assist gas jetting nozzle 13 so as to have a posture parallel to the front surface of the upper glass sheet 2 in a direction perpendicular to a preset cutting line CL extending in a surface direction of the glass sheet 2. The cross-section of the shaping gas jetting nozzle 14 and a jetting port 14a formed at a distal end thereof have a substantially rectangular shape, and the jetting port 14a is wide in a direction along the preset cutting line CL. The shaping gas A3 compressed in the gas compressor (not shown) passes through the inside of the shaping gas jetting nozzle 14 and is jetted from the jetting port 14a in parallel to the front surface of the upper glass sheet 2. Further, the shaping gas A3 is jetted from the side of a piece of the cut glass sheets 2 and 3 as a product portion G1 toward the side of a piece of the cut glass sheets 2 and 3 as a non-product portion G2 thereof. Note that, in plan view of the glass sheet, the preset cutting line CL is preferably formed of a closed path (such as a circle or a rectangle) in which a starting end and a terminal end are continuous to each other.

The processing stages 15 are installed in pairs so as to be parallel to each other across the preset cutting line CL. Further, both the processing stages 15 are movable in synchronization with each other in a direction T (direction parallel to the preset cutting line CL) illustrated in FIG. 7 under a state in which the glass sheets 2 and 3 are placed on the processing stages 15.

As described above, in the laser fusing apparatus 11, the laser irradiator 12 continuously irradiates the front surface of the upper glass sheet 2 with the laser L along the preset cutting line CL as the processing stages 15, on which the glass sheets 2 and 3 are placed, are moved in the direction T. Then, the assist gas A2 jetted from the assist gas jetting nozzle 13 blows off and scatters the molten glass M generated by melting the glass sheets 2 and 3 at the irradiation portion C of the laser L, to thereby remove the molten glass M. After that, the shaping gas A3 jetted from the shaping gas jetting nozzle 14 passes through a fusing end portion Ga, which is sequentially formed at the glass sheets 2 and 3 along with the removal of the molten glass M, along the front surface of the upper glass sheet 2 so as to be perpendicular to an advancing direction of the cutting of the glass sheets 2 and 3. Further, dross scattered when the molten glass M is removed is prevented from adhering to the lens 16 with the pressure of the gas A1 jetted from the laser irradiator 12.

Herein, the jetting pressures of the gas A1, the assist gas A2, and the shaping gas A3 are preferably 0.0 to 0.02 MPa, 0.00 to 0.25 MPa, and 0.01 to 1.00 MPa, respectively. Further, the separation distance between the jetting port 14a formed at the shaping gas jetting nozzle 14 and the preset cutting line CL is preferably 1 to 30 mm, more preferably 1 to 10 mm. Besides, the angle formed by the jetting direction of the assist gas A2 and the front surface of the upper glass sheet 2 is preferably 25 to 60°.

An action of the laser fusing method for a glass sheet using the above-mentioned laser fusing apparatus 11 is described with reference to the attached drawings. Note that, one of both the pieces of the cut glass sheet as the non-product portion is omitted from the drawings for illustrating the action.

Figure 8A:
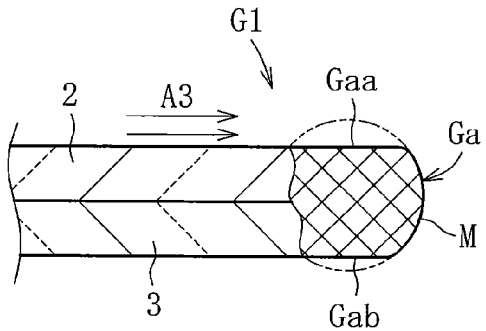
FIG. 8A is a view illustrating an actual situation of the laser fusing according to the first embodiment.

As illustrated in FIG. 8A, when the molten glass M generated by melting the glass sheets 2 and 3 at the irradiation portion C of the laser L is blown off and removed due to the pressure of the assist gas A2, the fusing end portion Ga is sequentially formed at the glass sheets 2 and 3. In this case, when the output power of the laser L is high, the amount of the molten glass M generated by melting the glass sheets 2 and 3 becomes excessive.

Figure 8B:
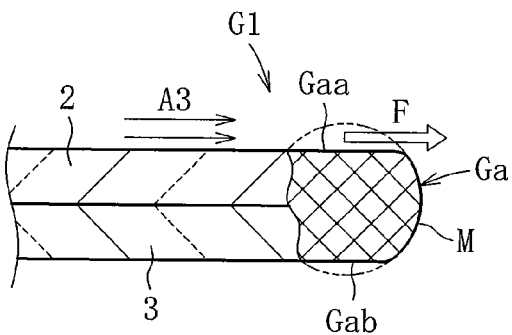
FIG. 8B is a view illustrating the actual situation of the laser fusing according to the first embodiment.

Thus, as indicated by the two-dot chain line of FIG. 8A, the molten glass M is to be rounded due to an action of the surface tension thereof and a front surface Gaa and a back surface Gab of the fusing end portion Ga are to be formed in a projected state (this state is also referred to as "lump"). However, as illustrated in FIG. 8B, a force F to push out a projection, which is to be formed on the front surface Gaa, in the surface direction of the glass sheet 2 (product portion G1) acts on the projection due to the pressure of the shaping gas A3.

Figure 8C:
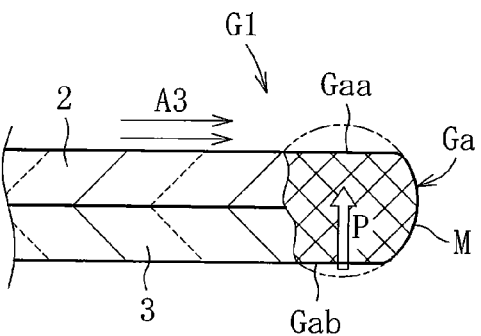
FIG. 8C is a view illustrating the actual situation of the laser fusing according to the first embodiment.
Figure 8D:
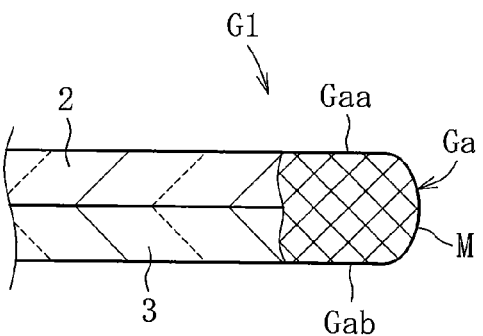
FIG. 8D is a view illustrating the actual situation of the laser fusing according to the first embodiment.

In addition, an atmospheric pressure is lower on the front surface Gaa side of the fusing end portion Ga than on the back surface Gab side thereof because the shaping gas A3 passes through the front surface Gaa side. Thus, as illustrated in FIG. 8C, a force P to push a projection, which is to be formed on the back surface Gab, from the back surface Gab side under the higher atmospheric pressure into the front surface Gaa side under the lower atmospheric pressure acts on the projection. These two forces F and P flatten both the front and back surfaces Gaa and Gab of the fusing end portion Ga so that, as illustrated in FIG. 8D, formation of the projection is prevented.

Further, when these actions are expressed, the shaping gas A3 is jetted in parallel to the front surface of the upper glass sheet 2, and hence the occurrence of such a situation that the flow rate of the jetted shaping gas A3 is reduced due to the impingement of the shaping gas A3 against the upper glass sheet 2 can be prevented to the extent possible. In addition, as the flow rate of the shaping gas A3 passing through the fusing end portion Ga is higher, the pressure of the shaping gas A3 applied to the projection to be formed on the front surface Gaa side becomes larger and a difference in atmospheric pressure between the front surface Gaa side and the back surface Gab side becomes larger. Thus, the action of pushing out, in the surface direction, the projection to be formed on the front surface Gaa of the fusing end portion Ga and the action of pushing, from the back surface Gab side into the front surface Gaa side, the projection to be formed on the back surface Gab are expressed satisfactorily.

Moreover, the jetting port 14a formed in the shaping gas jetting nozzle 14 is wide in the direction along the front surface of the upper glass sheet 2, and hence the jetted shaping gas A3 spreads over a wide range of the fusing end portion Ga in conformity with the shape of the jetting port 14a. Thus, it is possible to more stably prevent the formation of the projection on the fusing end portion Ga.

Further, the assist gas A2 is jetted toward the irradiation portion C of the laser L, and hence the molten glass M generated by melting the glass sheets 2 and 3 at the irradiation portion C can be scattered and removed due to the pressure of the assist gas A2. As a result, the molten glass M can be removed more quickly and more smoothly.

As a result, it is possible to avoid formation of the defective shape of the fusing end portion Ga, such as formation of a lump, due to the excessive amount of the molten glass M. In addition, the jetted shaping gas A3 passes through the fusing end portion Ga along the front surface of the upper glass sheet 2, and hence the fusing end portion Ga is also prevented from being strongly pressed due to the shaping gas A3 from the front surface Gaa side to the back surface Gab side. Thus, a droop is also prevented from being formed in the fusing end portion Ga due to the shaping gas A3.

Besides, the fear of the formation of a droop in the fusing end portion Ga due to the pressure of the assist gas A2 is also adequately eliminated as described below. That is, even if a droop is to be formed in the fusing end portion Ga due to the pressure of the assist gas A2, the above-mentioned force P to push the projection from the back surface Gab side into the front surface Gaa side also acts on the droop. Thus, the formation of a droop is adequately avoided. Note that, the term "droop" herein refers to a state in which the fusing end portion Ga is formed in a state of drooping downward in comparison to the other portion.

Further, dross generated when the glass sheets 2 and 3 are cut tends to be scattered toward the jetting destination side of the shaping gas A3. Therefore, the dross is difficult to adhere to the fusing end portion Ga of the product portion G1 of the cut glass sheets 2 and 3, which is positioned at the jetting source side of the shaping gas A3, resulting in high quality of the product portion G1.

Figure 9:
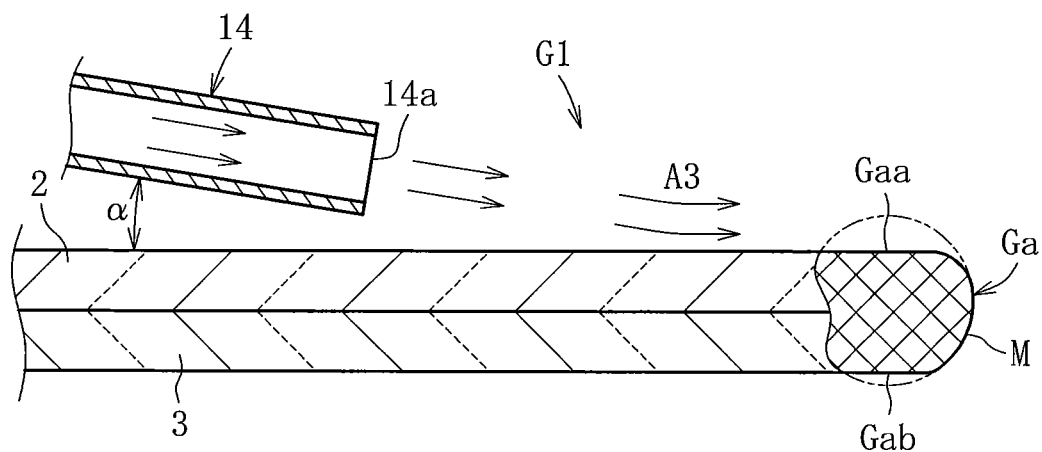
FIG. 9 is a cross-sectional view illustrating a modification of the laser fusing according to the first embodiment.

Herein, the above-mentioned laser fusing apparatus has a structure that the advancing direction of the cutting is perpendicular to the direction of the shaping gas passing through the irradiation portion of the laser. However, these directions may simply cross each other without being perpendicular to each other, or may be parallel to each other. That is, the shaping gas may be jetted in any direction as long as the jetted shaping gas passes though the irradiation portion of the laser along the front surface of the glass sheet. Further, the shaping gas is not necessarily jetted in parallel to the front surface of the glass sheet. As illustrated in FIG. 9, the shaping gas may be jetted in a direction oblique to the front surface of the upper glass sheet 2. Note that, in this case, an angle α formed by the jetting direction of the shaping gas and the front surface of the upper glass sheet 2 is preferably 0 to 25°.

Figure 10:
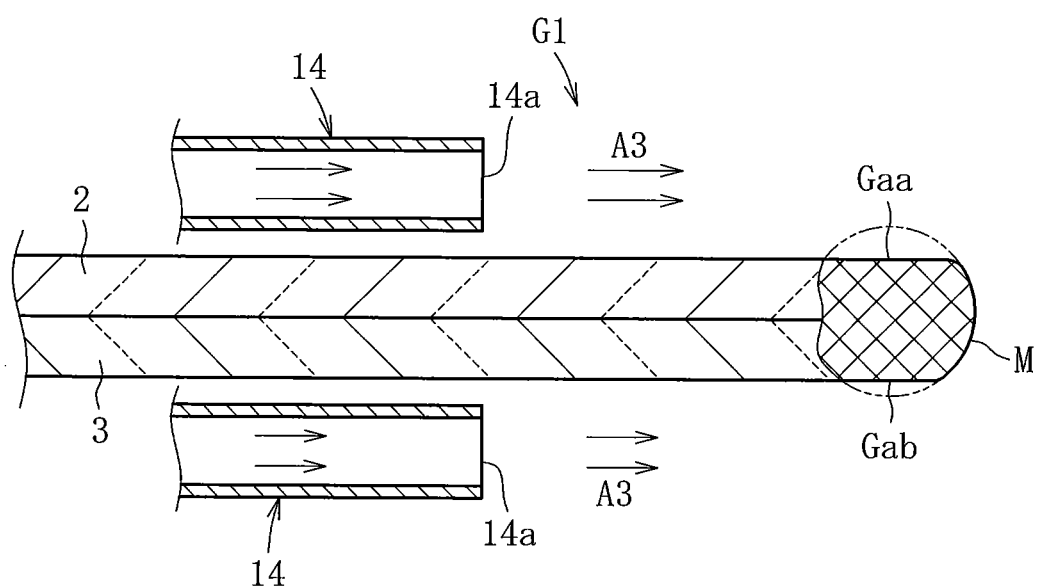
FIG. 10 is a cross-sectional view illustrating a modification of the laser fusing according to the first embodiment.

Moreover, in the above-mentioned laser fusing apparatus, the shaping gas is jetted so as to pass through only the front surface side of the fusing end portion along the front surface of the glass sheet, but as illustrated in FIG. 10, the shaping gas A3 may be jetted not only on the front surface Gaa side of the fusing end portion Ga but also on the back surface Gab side thereof. In this case, it is preferred that the shaping gas A3 to be jetted on the back surface Gab side be jetted at a lower flow rate when passing through the fusing end portion Ga than the shaping gas A3 to be jetted on the front surface Gaa side. As a result, a state in which the atmospheric pressure on the back surface Gab side is higher than that on the front surface Gaa side is maintained, and hence it is possible to eliminate the fear of the loss of the action of pushing the projection to be formed at the back surface Gab into the front surface Gaa side from the back surface Gab side. Note that, also in the case of jetting the shaping gas A3 so as to pass through the back surface Gab, the shaping gas A3 may be jetted in a direction oblique to the back surface of the lower glass sheet 3. As a matter of course, the shaping gas A3 may be jetted to only the back surface Gab side of the fusing end portion Ga of the lower glass sheet 3, and also in this case, a certain effect of preventing the generation of a lump and a droop is exerted.

In addition, the above-mentioned laser fusing apparatus has a structure that the assist gas is jetted so as to scatter and remove the molten glass, but the molten glass may be removed without jetting the assist gas. In this case, moisture and volatile components in glass or energy generated when the glass itself vaporizes and swells serve as a driving force to remove the molten glass. With this, the molten glass is scattered and removed.

Further, in the above-mentioned example, the shape of the jetting port formed in the shaping gas jetting nozzle is rectangular, but the shape is not limited to the rectangular shape and a jetting port having any kind of shape may be formed. However, the jetting port is preferably shaped so that the shaping gas jetted from the jetting port spreads over a wide range of the fusing end portion. Examples of such a shape comprise an oval shape having a major axis in the direction parallel to the front surface of the glass sheet.

Moreover, the above-mentioned embodiment provides a mode that the glass sheet placed on the processing stages is fused, but, for example, there may be adopted a mode that a band-like glass ribbon formed by an overflow method or a float method is continuously fused. Alternatively, there may be adopted a mode that a glass roll obtained by rolling a glass ribbon into a roll shape is used to carryout fusing by roll-to-roll processing (mode that a glass ribbon is unrolled from a glass roll to be subjected to predetermined processing, and then the processed glass ribbon is again rolled into a glass roll).

(2) Second Embodiment

In the above-mentioned first embodiment, the method of manufacturing a glass sheet laminate is described. A second embodiment of the present invention differs from the first embodiment in annealing the vicinity of the fusing end portion of the glass sheet laminate.

Figure 11A:
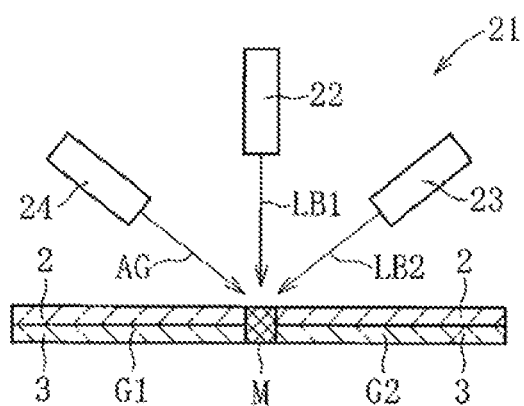
FIG. 11A is a front view for illustrating a method of manufacturing a glass sheet laminate according to a second embodiment of the present invention.
Figure 11B:
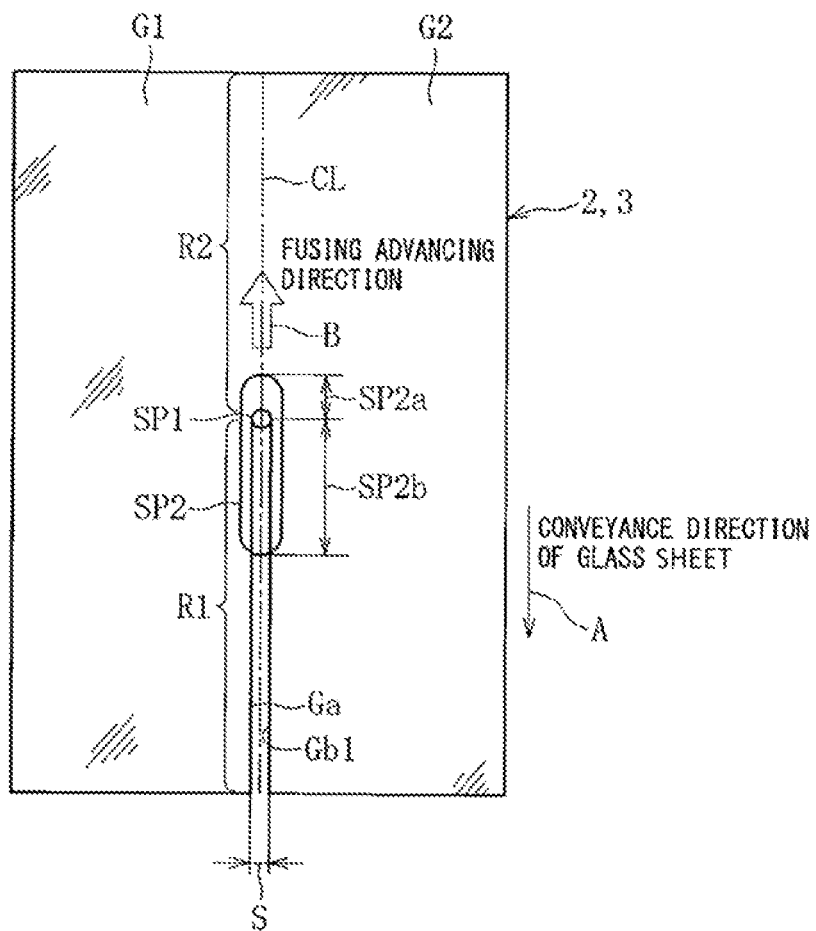
FIG. 11B is a plan view for illustrating the method of manufacturing a glass sheet laminate according to the second embodiment.

That is, as illustrated in FIGS. 11A and 11B, a laser fusing apparatus 21 according to the second embodiment comprises a fusing laser irradiator 22, an annealing laser irradiator 23, and an assist gas jetting nozzle 24. Note that, in the drawings, the shaping gas jetting nozzle 14 described in the first embodiment is omitted.

The fusing laser irradiator 22 substantially vertically irradiates the preset cutting line CL formed on the two laminated glass sheets 2 and 3 with a fusing laser LB1. Due to the fusing laser LB1, a first irradiation region SP1 is formed at a part of the preset cutting line CL of the glass sheets 2 and 3. In this embodiment, the glass sheets 2 and 3 are moved in a conveyance direction (arrow A direction in FIG. 11B) by processing stages (not shown) (for example, conveyor belts for sucking and holding the glass sheets 2 and 3), and the first irradiation region SP1 is scanned along the preset cutting line CL, to thereby continuously perform laser fusing on the laminated glass sheets 2 and 3. In this case, a fusing gap S is formed between a fusing end surface Ga of the product portion G1 side and a fusing end surface Gb of the non-product portion G2 side.

The annealing laser irradiator 23 obliquely irradiates the preset cutting line CL with an annealing laser LB2 from above as the non-product portion G2 side. Due to the annealing laser LB2, a second irradiation region SP2 serving as an annealing performing portion is formed at a part of the preset cutting line CL of the glass sheets 2 and 3. The second irradiation region SP2 is a region having an elongate shape (such as an oval shape) that extends along the preset cutting line CL, and the dimension of the second irradiation region SP2 is larger in a fusing advancing direction (arrow B direction in FIG. 11B) along the preset cutting line CL than the dimension of the first irradiation region SP1 for the fusing laser LB1. Then, the second irradiation region SP2 overlaps the first irradiation region SP1 so that the second irradiation region SP2 covers the regions in the front and the rear of the first irradiation region SP1 in the fusing advancing direction. That is, under a state in which the first irradiation region SP1 and the second irradiation region SP2 have the overlapping portion, the second irradiation region SP2 extends over the front and the rear of the first irradiation region SP1 in the fusing advancing direction. Thus, when the glass sheets 2 and 3 are heated at the second irradiation region SP2, in regions continuous to the front and the rear of the first irradiation region SP1 in the fusing advancing direction, the glass sheets 2 and 3 are heated at a low temperature (for example, 100 to 1,000° C.) lower than the fusing temperature (for example, 1,300 to 3,000° C.). That is, the glass sheets 2 and 3 are preheated in a region SP2a of the second irradiation region SP2, which is located on the front side of the first irradiation region SP1 in the fusing advancing direction, and the glass sheets 2 and 3 are annealed in a region SP2b of the second irradiation region SP2, which is located on the rear side of the first irradiation region SP1 in the fusing advancing direction. Then, the second irradiation region SP2 is scanned along the preset cutting line CL while the glass sheets 2 and 3 are moved as described above, and the preheating and the annealing are continuously performed on the glass sheets 2 and 3 before and after the fusing thereof.

The assist gas jetting nozzle 24 jets an assist gas AG to the first irradiation region SP1 from above in order to blow off the molten glass M generated at the first irradiation region SP1. Specifically, in this embodiment, the assist gas jetting nozzle 24 is arranged above the product portion G1 side so that the assist gas AG is jetted to the first irradiation region SP1 in an obliquely downward direction. Note that, the arrangement position of the assist gas jetting nozzle 24 is not particularly limited. For example, the assist gas jetting nozzle 24 may be arranged immediately above the preset cutting line CL so that the assist gas AG is jetted substantially vertically to the glass sheets 2 and 3 together with the fusing laser. Alternatively, the assist gas jetting nozzle 24 may be arranged in a space below the glass sheets 2 and 3 so as to blow off the molten glass from below. Such an assist gas AG is used for efficiently performing the fusing, but may be omitted.

Figure 12:
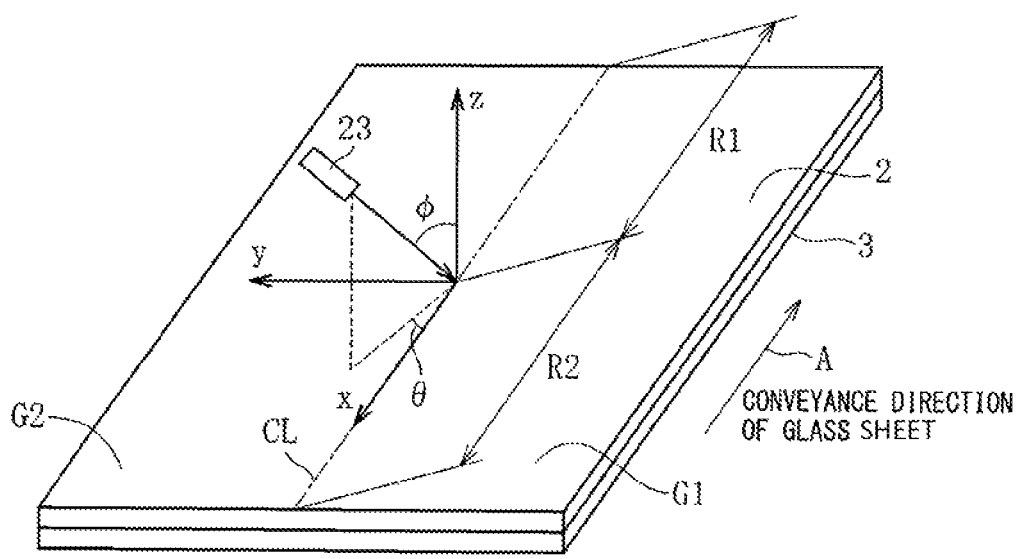
FIG. 12 is a perspective view illustrating an irradiation state of an annealing laser in FIG. 11.
Figure 13:
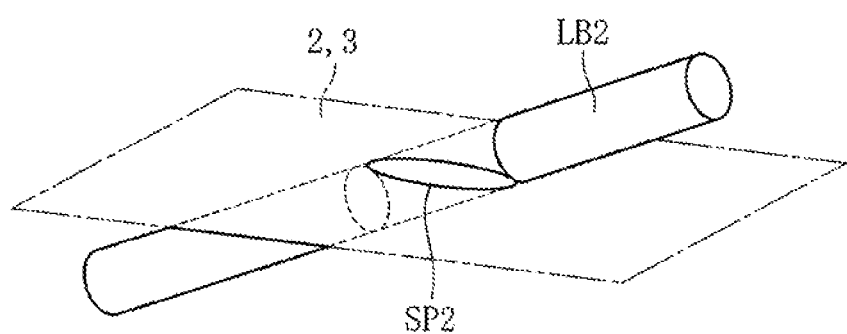
FIG. 13 is a perspective view illustrating the irradiation state of the annealing laser in FIG. 11.

In this embodiment, as illustrated in FIG. 12, the annealing laser irradiator 23 is arranged at a position above the non-product portion G2 side of a fusing uncompleted portion R2. The annealing laser LB2 emitted from the annealing laser irradiator 23 is inclined so as to come closer to the glass sheets 2 and 3 as the annealing laser LB2 travels from the fusing uncompleted portion R2 side to a fusing completed portion R1 side. Note that, the annealing laser LB2 may be inclined so as to come closer to the glass sheets 2 and 3 as the annealing laser LB2 travels from the fusing completed portion R1 side to the fusing uncompleted portion R2 side. That is, the annealing laser LB2 has such an azimuth angle $\theta$ and a polar angle $\phi$ as illustrated in FIG. 12. Herein, xyz in FIG. 12 refers to a Cartesian coordinate system and x refers to an axis parallel to the conveyance direction of the glass sheets. Thus, as illustrated in FIG. 13, the second irradiation region SP2 projected on the glass sheets 2 and 3 has an oval shape. The direction of the major axis of the oval shape changes depending on the degree of the azimuth angle $\theta$ and the major axis has a component in the fusing advancing direction. Note that, as a matter of course, the shape itself in a cross-section perpendicular to the optical axis of the annealing laser LB2 may be shaped into an oval shape in advance so that the direction of the major axis of the oval extends along the fusing advancing direction. Examples of the method of shaping the cross-section perpendicular to the optical axis of the laser into an oval shape include a method using an optical component such as a cylindrical lens, a slit-like light shielding mask, or the like.

Figure 14A:
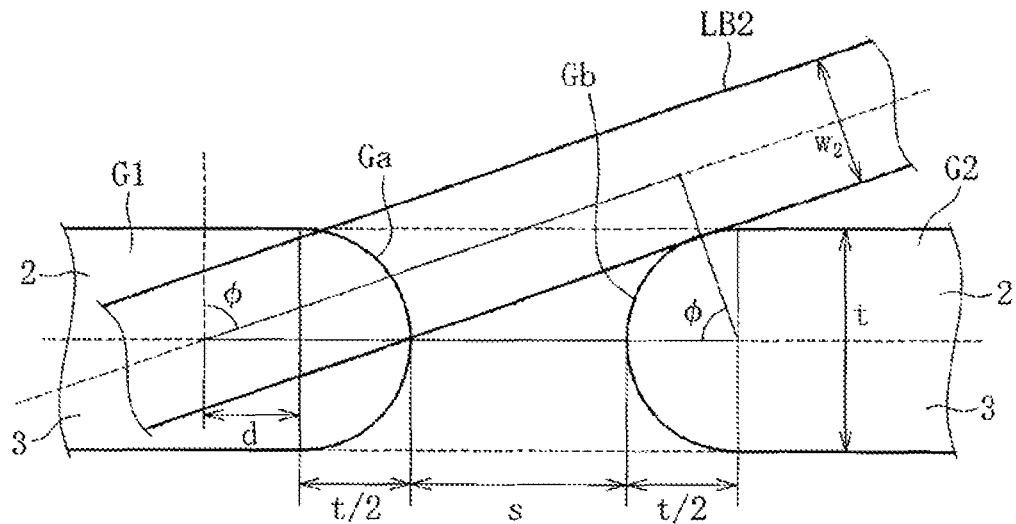
FIG. 14A is a conceptual view for illustrating an irradiation state in a case where a collimated beam is used as the annealing laser in FIG. 11.
Figure 14B:
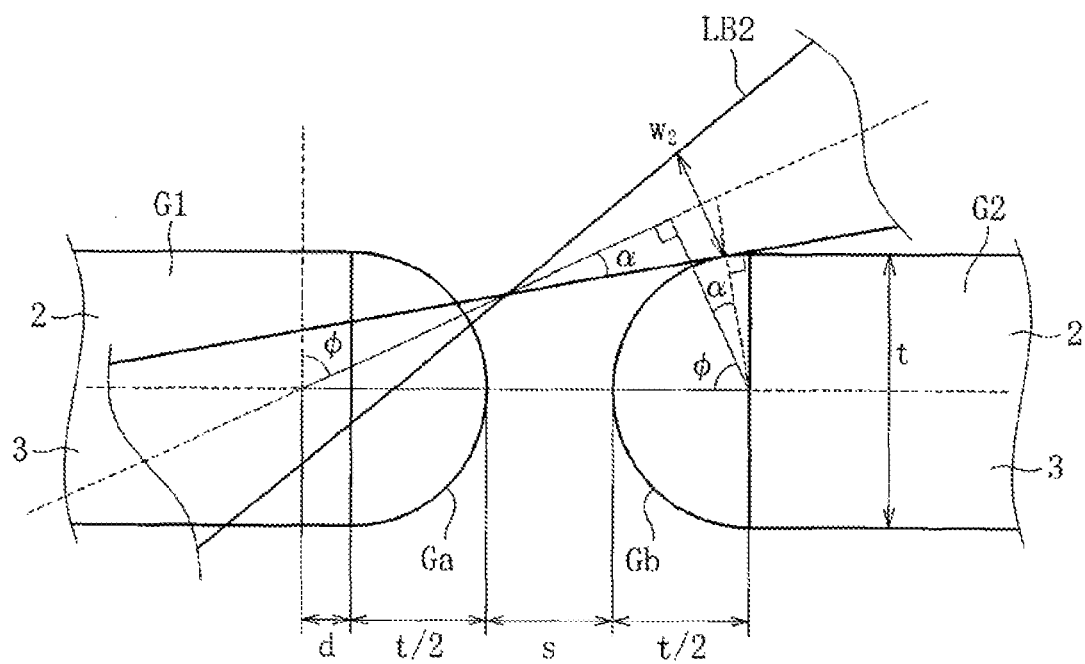
FIG. 14B is a conceptual view for illustrating an irradiation state in a case where a converging beam is used as the annealing laser in FIG. 11 and the converging beam is defocused for irradiation.

Herein, the azimuth angle $\theta$ and the polar angle $\phi$ of the annealing laser LB2 are each preferably in the following range. That is, the azimuth angle $\theta$ is preferably in a range of $0 \leq \theta \leq \pi$. When a collimated beam is adopted as the annealing laser LB2, even if the azimuth angle $\theta$ is in any of a range of $0 \leq \theta \leq \pi/2$ and a range of $\pi/2 \leq \theta \leq \pi$, the same irradiation effect is provided. However, when a converging beam is adopted and defocus irradiation is performed, the azimuth angle $\theta$ needs to be in a proper range. That is, when the defocus irradiation is performed on the glass sheets 2 and 3 at a position below the converging point, the proper range is $0 \leq \theta \leq \pi/2$. On the contrary, when the defocus irradiation is performed on the glass sheets 2 and 3 at a position above the converging point, the proper range is $\pi/2 \leq \theta \leq \pi$. On the other hand, the polar angle $\phi$ preferably satisfies the following range when, as illustrated in FIG. 14A, a collimated beam is adopted as the annealing laser LB2. That is, when the beam diameter of the annealing laser LB2 is referred to as w2, the total thickness of the glass sheets 2 and 3 in a laminated state is referred to as t, and the adjustment amount of the irradiation position is referred to as d, the polar angle $\phi$ preferably satisfies a range of $0 \leq \phi \leq \cos^{-1}[(t+w_2)/\{2(s+t+d)\}]$. Further, when a converging beam is adopted as the annealing laser LB2 and defocus irradiation is performed as illustrated in FIG. 14B, the polar angle $\phi$ preferably satisfies the following range. That is, when the beam diameter of the annealing laser LB2 at the contact point in a state in which the annealing laser LB2 is held in contact with the non-product portion G2 is referred to as $w_2$, the converging angle is referred to as $\alpha$, the total thickness of the glass sheets 2 and 3 is referred to as t, and the adjustment amount of the irradiation position is referred to as d, the polar angle $\phi$ preferably satisfies a range of $0 \leq \phi \leq \cos^{-1}[(t \cos \alpha + w_2)/\{2(s+t+d)\}]$. In other words, the polar angle $\phi$ is preferably set in an angle range in which the annealing laser LB2 does not interfere with the vicinity of the fusing end surface Gb of the non-product portion G2 closely facing the fusing end surface Ga of the product portion G1. The irradiation position of the annealing laser LB2 is preferably adjusted depending on the position of a tensile stress generated in the vicinity of the fusing end surface Ga of the product portion G1 before annealing, and the adjustment amount d thereof is adjusted, for example, in a range of $-0.5t \leq d \leq 2.5t$.

Note that, when a cross-section perpendicular to the optical axis of the annealing laser LB2 is shaped into an oval shape, even if the oblique angle (polar angle $\phi$) thereof is not increased, the second irradiation region SP2 with a long total length can be formed.

Next, the operation of the laser fusing apparatus 21 constructed as described above is described.

First, as illustrated in FIGS. 11A and 11B, the glass sheets 2 and 3 are irradiated with the fusing laser LB1 emitted from the fusing laser irradiator 22 while being conveyed, to thereby perform fusing of the glass sheets 2 and 3. The assist gas AG is jetted from the assist gas jetting nozzle 24 to the first irradiation region SP1 formed by the fusing laser LB1, to thereby blow off the molten glass M out of the first irradiation region SP1.

In addition, the glass sheets 2 and 3 are simultaneously irradiated with the annealing laser LB2 emitted from the annealing laser irradiator 23. The second irradiation region SP2 for the annealing laser LB2 overlaps the first irradiation region SP1 for the fusing laser LB1 so that the second irradiation region SP2 covers the regions in the front and the rear of the first irradiation region SP1 in the fusing advancing direction. Due to the overlapping, the glass sheets 2 and 3 are preheated in the region SP2*a* of the second irradiation region SP2, which is located on the front side of the first irradiation region SP1 in the fusing advancing direction, and the glass sheets 2 and 3 are annealed in the region SP2*b* of the second irradiation region SP2, which is located on the rear side thereof in the fusing advancing direction. Thus, it is possible to reduce, to the extent possible, the situation that breakage occurs due to a sharp increase in temperature before fusing and a sharp decrease in temperature after fusing, that is, breakage occurs due to thermal shock or thermal residual strain occurs. Then, the second irradiation region SP2 playing a role in performing the preheating and annealing overlaps the first irradiation region SP1, and hence the regions SP2*a*, SP1, and SP2*b* for respectively performing the preheating, fusing, and annealing are continuously formed simply and reliably in the fusing advancing direction. Thus, such a series of heat treatment is sequentially performed on the glass sheets 2 and 3, and hence it is possible to avoid the situation that thermal energy is lost improperly between the heat treatment regions SP2*a*, SP1, and SP2*b*. In other words, while preheating and fusing are efficiently performed due to the thermal energy supplied to the glass sheets 2 and 3, the thermal residual strain can be removed.

Figure 15A:
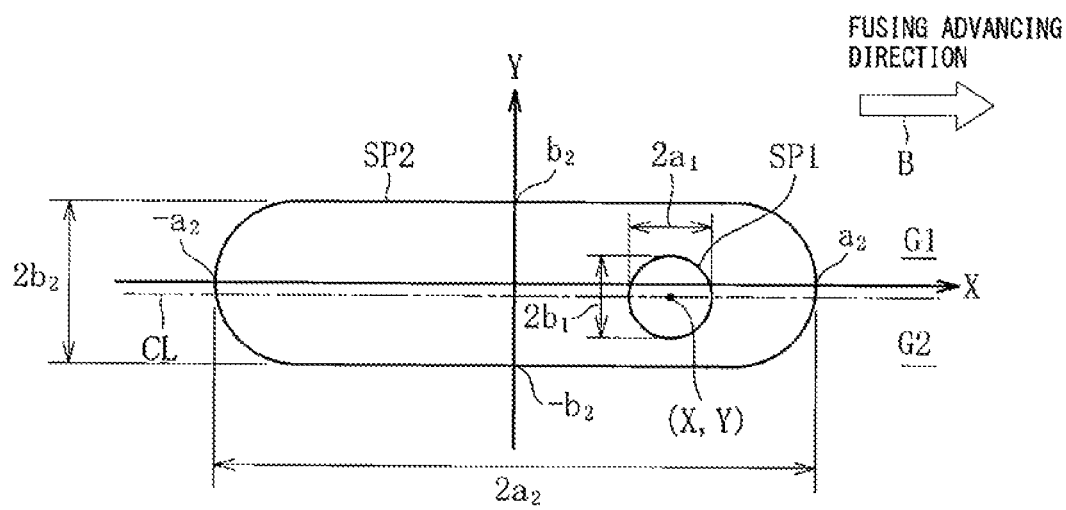
FIG. 15A is a view for illustrating a positional relationship between respective irradiation regions of a fusing laser and the annealing laser in FIG. 11.

Herein, as illustrated in FIG. 15A, when a line passing through the center position of the second irradiation region SP2 in the direction perpendicular to the fusing advancing direction and extending in the fusing advancing direction is referred to as an X axis, a line perpendicular to the X axis at the center position of the second irradiation region SP2 in the fusing advancing direction is referred to as a Y axis, the dimension of the second irradiation region SP2 in the X axis direction is referred to as $2a_2$, the dimension of the second irradiation region SP2 in the Y axis direction is referred to as $2b_2$, the dimension of the first irradiation region SP1 in the X axis direction is referred to as $2a_1$, the dimension of the first irradiation region SP1 in the Y axis direction is referred to as $2b_1$, and the central coordinates of the first irradiation region SP1 are referred to as (x, y), a preferred relationship between the first irradiation region SP1 and the second irradiation region SP2 is as follows.

That is, the relationship in spot diameter between the first irradiation region SP1 and the second irradiation region SP2 is $a_1 < a_2$ and $b_1 < b_2$. However, the following relationship is preferred.

$$50a_1 \leq a_2$$

$$30b_1 \leq b_2 \quad (1)$$

Further, the central coordinates (x, y) of the first irradiation region SP1 preferably satisfy the following relationship (the region indicated by A1 in FIG. 15B), $$-a_2/4 \leq x < a_2 - a_1$$

$$-b_2 - b_1 < y \leq b_2/2 \quad (2)$$

Figure 15B:
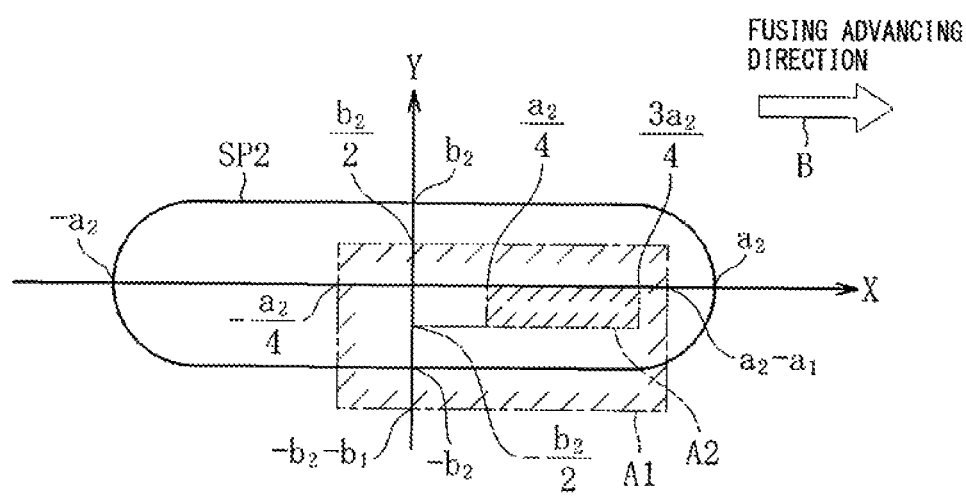
FIG. 15B is a view for illustrating a preferred range of the positional relationship between the respective irradiation regions of the fusing laser and the annealing laser in FIG. 11.

More preferably, the following relationship is satisfied (the region indicated by A2 in FIG. 15B).

$$a_2/4 \leq x \leq 3a_2/4$$

$$-b_2/2 \leq y \leq 0 \quad (3)$$

When the above-mentioned expression (1) or (2) is satisfied, the size relationship and positional relationship between the first irradiation region SP1 and the second irradiation region SP2 are optimum, and the occurrence of thermal residual strain in the product portion G1 of the glass sheets 2 and 3 can be reliably reduced. Further, when the expression (3) is satisfied, the second irradiation region SP2 is unevenly formed on the product portion G1 side rather than the non-product portion G2 side, and at the front side of the center position (position of the Y axis) of the second irradiation region SP2 in the fusing advancing direction, the first irradiation region SP1 overlaps the second irradiation region SP2. As a result, preheating treatment and annealing treatment can be preferentially performed on the product portion G1 side of the glass sheets 2 and 3, and hence the thermal residual strain in the product portion G1 can be reduced more reliably. Further, in this case, in the irradiation region SP2, the dimension in the fusing advancing direction of the region SP2*b* for performing annealing is longer than the dimension in the fusing advancing direction of the region SP2*a* for performing preheating. Thermal residual strain is caused by quenching after fusing, and hence the mode in which the size of the region for performing annealing is lengthened as described above to reduce the cooling rate is preferred from the viewpoint of removing thermal residual strain.

Herein, in the fusing of the glass sheets 2 and 3, melting starts due to the fusing laser LB1 from the upper surface side of the upper glass sheet 2, followed by downward penetration of a cutting groove formed by the melting, thus completing the fusing. Thus, a part of the fusing end surface Ga of the product portion G1, which is closer to the upper surface, is more strongly affected by irradiation heat supplied at the time of the fusing, and hence it is considered that the thermal residual strain in the fusing end surface Ga is relatively more significant on the upper surface side. Therefore, in order to remove the thermal residual strain in the fusing end surface Ga of the product portion G1, it is preferred to supply more heat on the upper surface side of the fusing end surface Ga, to thereby perform annealing treatment. Thus, it is preferred that the annealing laser LB2 be, as illustrated in FIGS. 14A and 14B, directly radiated to the upper portion (for example, upper half region) of the fusing end surface Ga of the product portion G1. In this case, the fusing end surface Ga, which is an object to be annealed, is irradiated with the annealing laser LB2 obliquely from above through the fusing gap S, which is formed by the fusing between the fusing end surfaces Ga and Gb.

Further, it is preferred that lasers oscillated by different oscillators be used as the fusing laser and the annealing laser so that both the lasers have different wavelengths. As a result, an interference fringe, which is stationary in time, is not formed by the fusing laser and the annealing laser, thereby facilitating satisfactory control of the distribution of energy to be supplied to the glass sheets.

Figure 16A:
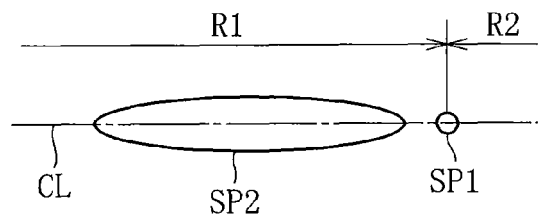
FIG. 16A is a view illustrating a modification of an irradiation mode of the fusing laser and the annealing laser in FIG. 11.
Figure 16B:
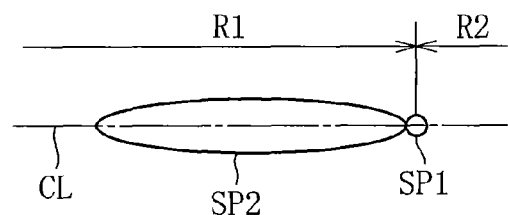
FIG. 16B is a view illustrating a modification of the irradiation mode of the fusing laser and the annealing laser in FIG. 11.

Note that, in the above-mentioned embodiment, a description is made of the case in which the second irradiation region SP2 is formed while overlapping the first irradiation region SP1 so that the second irradiation region SP2 covers the regions in the front and the rear of the first irradiation region SP1 in the conveyance direction. However, the first irradiation region SP1 and the second irradiation region SP2 may be separated from each other as illustrated in FIG. 16A, and the outer peripheral edges of both the regions may be held in contact with each other as illustrated in FIG. 16B.

Further, the glass sheets 2 and 3 are heated at a temperature equal to or less than the softening point thereof by the annealing laser LB2 in the second irradiation region SP2 and in the vicinity thereof, and hence a dehydration reaction occurs in a wider range of the surface contact portion 9 as compared to a case in which the fusing laser LB1 is radiated solely. Therefore, the formation range of the second quasi-welded portion 7b can be broadened, thereby being capable of securing higher airtightness. Note that, the formation range of the second quasi-welded portion 7b can be appropriately changed by adjusting the annealing laser LB2 and the like.

(3) Third Embodiment

Figure 17:
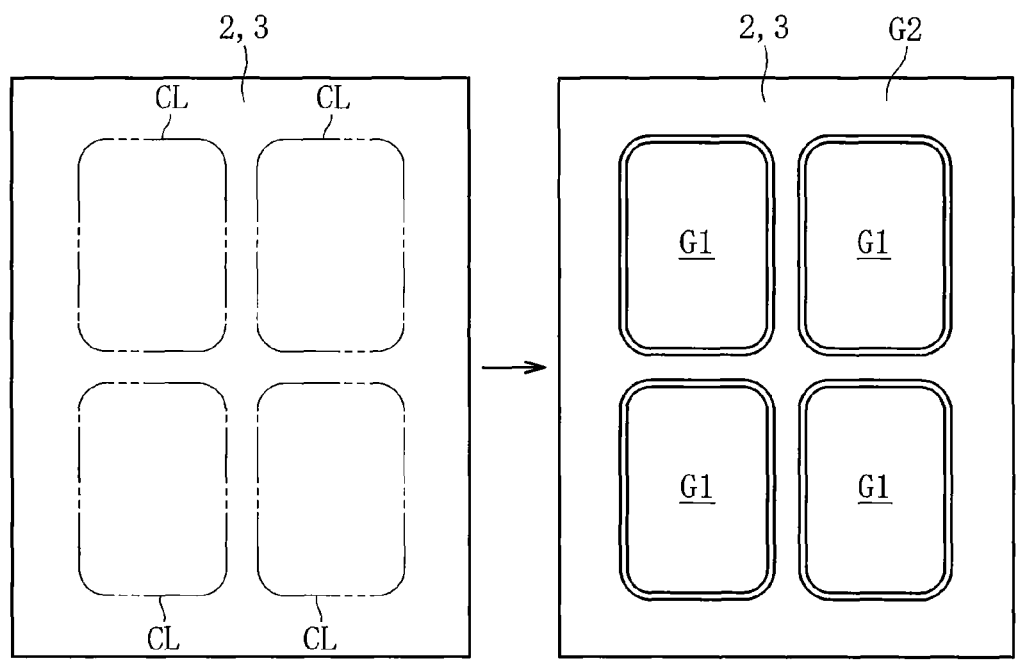
FIG. 17 is a plan view for illustrating a method of manufacturing a glass sheet laminate according to a third embodiment of the present invention.

In each of the above-mentioned first and second embodiments, a description is made of the case in which two glass sheets are laminated to form a surface contact portion, and laser fusing is then performed on a periphery thereof, to thereby manufacture one product portion (glass sheet laminate). In a third embodiment of the present invention, as illustrated in FIG. 17, the two glass sheets 2 and 3 are laminated to form a surface contact portion, and then cut out along a plurality of preset cutting lines (four lines in the example of FIG. 17) CL formed into a substantially rectangular shape, to thereby manufacture a plurality of product portions G1, that is, a plurality of glass sheet laminates 1. Note that, the third embodiment is common to the first and second embodiments except that multiple glass sheet laminates 1 are manufactured, and hence detailed description thereof is omitted.

Figure 18:
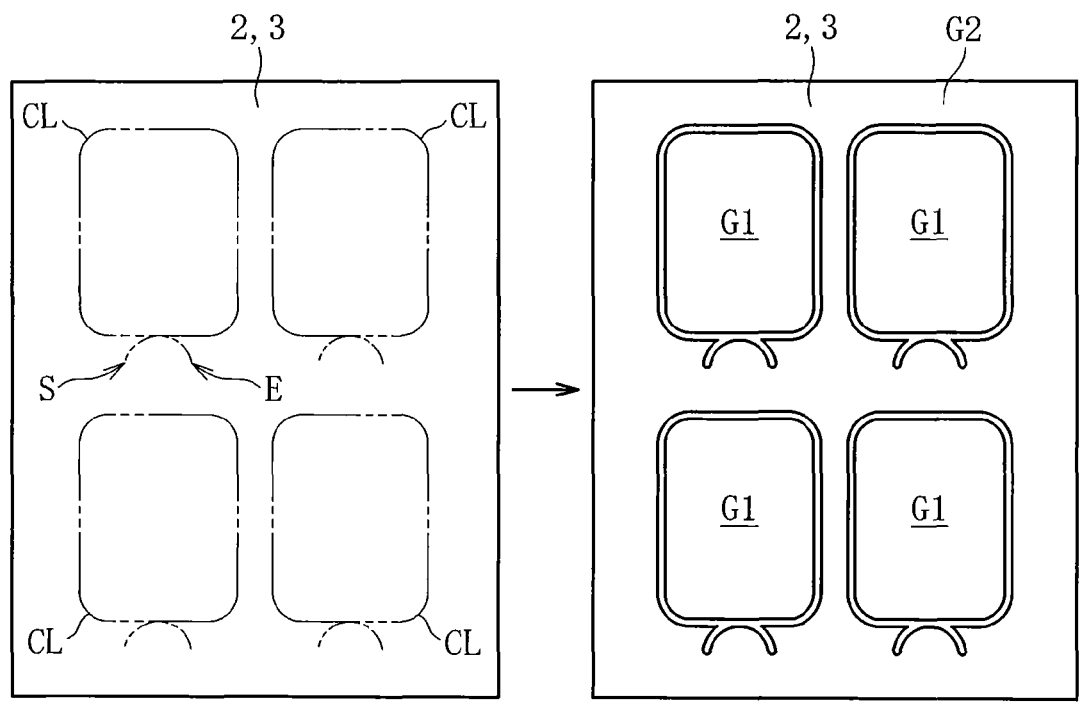
FIG. 18 is a plan view for illustrating a modification of the method of manufacturing a glass sheet laminate according to the third embodiment.

Note that, in this case, as illustrated in FIG. 18, a start point S and an end point E of each of the preset cutting lines CL may be formed in a region other than the region for forming each of the product portions G1. Further, the start point S and the end point E may not be identical to each other.

(4) Fourth Embodiment

Figure 19:
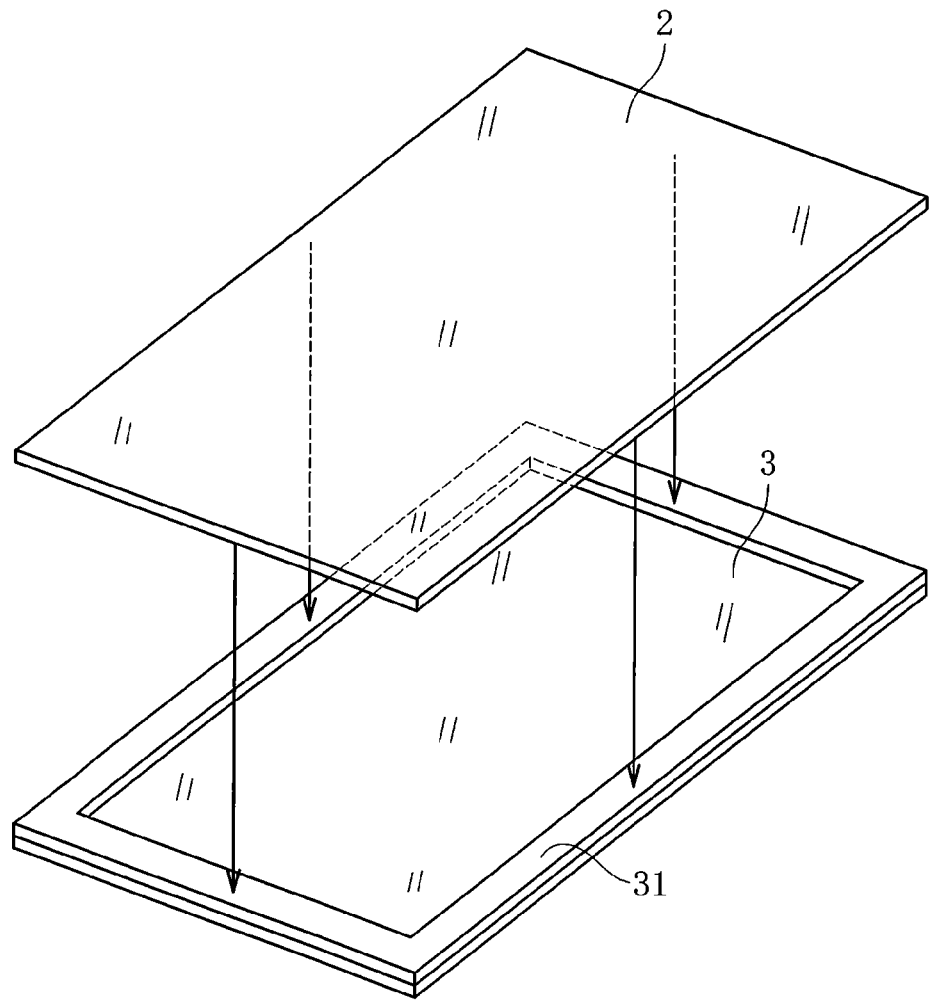
FIG. 19 is a perspective view for illustrating a manufacturing procedure for a glass sheet laminate according to a fourth embodiment of the present invention.
Figure 20:
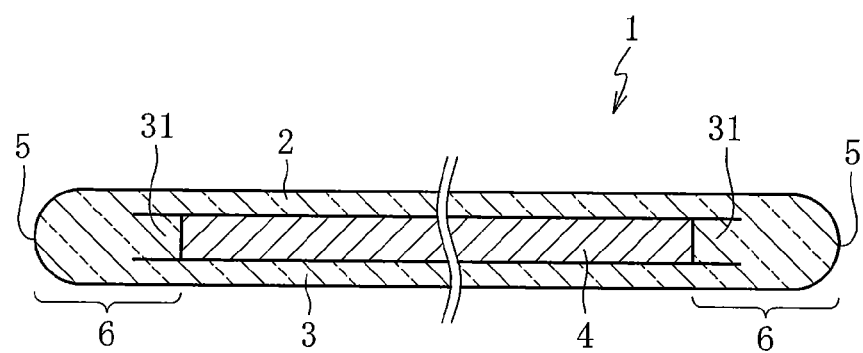
FIG. 20 is a cross-sectional view illustrating the glass sheet laminate according to the fourth embodiment.

In each of the first to third embodiments, the case of laminating the two glass sheets is described. In a fourth embodiment of the present invention, as illustrated in FIG. 19, a frame-like glass sheet 31 serving as a spacer is arranged at the periphery of one glass sheet 3, and another glass sheet 2 is laminated thereon. Note that, a functional member (not shown) is formed or arranged on the glass sheet 3 surrounded by the glass sheet 31. In this case, each contact portion at which each surface of the glass sheets 2 and 3 is held in contact with each surface of the glass sheet 31 serving as a spacer constructs each surface contact portion. Then, when laser fusing is performed on the surface contact portion, as illustrated in FIG. 20, a glass sheet laminate 1 having a sealed portion 6 comprising an outer peripheral portion 5 formed of a fusing end surface can be manufactured. Note that, the laser fusing method and the like in the fourth embodiment are common to those in the first and second embodiments, and hence detailed description thereof is omitted.

EXAMPLES

As examples of the present invention, it was confirmed that, under each of the laser fusing and annealing conditions shown in Table 1, the glass sheet laminate according to the present invention was able to be manufactured. Note that, two glass sheets are laminated in Example 1 and three glass sheets are laminated in Example 2. Further, the glass sheets used in any of the examples have a thickness of 0.1 mm.

TABLE 1

| | | Example 1 | Example 2 |
|---|---|---|---|
| Fusing step | Type of laser | $CO_2$ laser | $CO_2$ laser |
| | Wavelength of laser | 10.6 μm | 10.6 μm |
| | Energy density of laser | 2.2 kW/mm$^2$ | 0.9 kW/mm$^2$ |
| | Spot diameter of laser | 140 μm | 210 μm |
| | Conveyance speed of glass sheet | 10 mm/s | 20 mm/s |
| | Jetting pressure of shaping gas | 0.3 MPa | 0.3 MPa |
| | Jetting angle of shaping gas | 0° (horizontal) | 0° (horizontal) |
| Annealing step | Type of laser | $CO_2$ laser | $CO_2$ laser |
| | Wavelength of laser | Around 10.6 μm | Around 10.6 μm |
| | Energy density of laser | 2.17 W/mm$^2$ | 4.09 W/mm$^2$ |
| | Spot diameter of laser | 5 mm | 5 mm |
| | Conveyance speed of glass sheet | 10 mm/s | 20 mm/s |

REFERENCE SIGNS LIST 1 glass sheet laminate
2, 3 glass sheet
4 functional member
5 outer peripheral portion (fusing end surface)
6 sealed portion
7 first joining portion
7a welded portion
7b quasi-welded portion
8 second joining portion
9 surface contact portion
10 roller
11 laser fusing apparatus
12 laser irradiator
13 assist gas jetting nozzle
14 shaping gas jetting nozzle
15 processing stage
16 lens
21 laser fusing apparatus
22 fusing laser irradiator
23 annealing laser irradiator
24 assist gas jetting nozzle
31 glass sheet

The invention claimed is:

1. A method of manufacturing a glass sheet laminate to be formed by integrally laminating glass sheets, the method comprising:
   laminating the glass sheets by bringing surfaces thereof including a preset cutting line into surface contact with each other so as to form a surface contact portion;
   performing laser fusing along the preset cutting line included in the surface contact portion under a state in which the surface contact portion has a surface roughness of 2.0 nm or less;
   processing a fusing end surface of the surface contact portion into a curved surface and sealing the fusing end surface with heat generated when the laser fusing is performed;
   containing a functional member between the glass sheets;
   forming the surface contact portion around the functional member; and
   performing the laser fusing after the surface contact portion is formed.

2. The method of manufacturing a glass sheet laminate according to claim 1, further comprising annealing a vicinity of the fusing end surface through irradiation with a laser having a lower energy density than a laser used for the laser fusing.

3. The method of manufacturing a glass sheet laminate according to claim 1, wherein the glass sheets comprise three or more glass sheets.

4. The method of manufacturing a glass sheet laminate according to claim 1, wherein the glass sheets have a total thickness of 0.5 mm or less.

5. A method of manufacturing a glass sheet laminate to be formed by integrally laminating glass sheets, the method comprising:

laminating the glass sheets by bringing surfaces thereof including a preset cutting line into surface contact with each other so as to form a surface contact portion;

performing laser fusing along the preset cutting line included in the surface contact portion under a state in which the surface contact portion has a surface roughness of 2.0 nm or less;

processing a fusing end surface of the surface contact portion into a curved surface and sealing the fusing end surface with heat generated when the laser fusing is performed; and performing compression bonding of the surface contact portion before the laser fusing.

6. A method of manufacturing a glass sheet laminate to be formed by integrally laminating glass sheets, the method comprising:

laminating the glass sheets by bringing surfaces thereof including a preset cutting line into surface contact with each other so as to form a surface contact portion;

performing laser fusing along the preset cutting line included in the surface contact portion under a state in which the surface contact portion has a surface roughness of 2.0 nm or less; and processing a fusing end surface of the surface contact portion into a curved surface and sealing the fusing end surface with heat generated when the laser fusing is performed, wherein the surface contact portion is formed under a reduced-pressure atmosphere.

\* \* \* \* \*